United States Patent [19]

Hoffman

[11] 4,070,518

[45] Jan. 24, 1978

[54] COPPER METALLIZATIONS

[75] Inventor: Lewis Charles Hoffman, Hockessin, Del.

[73] Assignee: E. I. Du Pont de Nemours and Company, Wilmington, Del.

[21] Appl. No.: 732,749

[22] Filed: Oct. 15, 1976

[51] Int. Cl.$^2$ .............................................. H01B 1/02
[52] U.S. Cl. .................................. 428/209; 428/210; 428/901; 252/512; 106/1.13; 106/1.05
[58] Field of Search ................ 252/512, 518.1; 106/1, 106/53; 428/433, 901, 209, 210

[56] References Cited

U.S. PATENT DOCUMENTS

| | | | |
|---|---|---|---|
| 2,993,815 | 7/1961 | Treptow | 252/512 X |
| 3,484,284 | 12/1969 | Dates et al. | 252/518 X |
| 3,647,532 | 3/1972 | Friedman et al. | 252/512 X |
| 3,827,891 | 8/1974 | Larry | 106/1 |
| 3,950,174 | 4/1976 | Suzuki et al. | 106/53 X |
| 3,970,465 | 7/1976 | Houben | 106/53 |
| 3,970,590 | 7/1976 | Hoffman et al. | 106/1 X |

*Primary Examiner*—Benjamin R. Padgett
*Assistant Examiner*—E. Suzanne Parr

[57] ABSTRACT

Copper-based metallizations, useful in the electronics art, comprising copper powder and certain alkali metal/lead borosilicate glass powders. The copper and glass may be dispersed in an inert liquid vehicle, printed on a substrate, and fired in a nitrogen atmosphere to produce conductor patterns. Also the resultant fired conductor patterns.

16 Claims, No Drawings

COPPER METALLIZATIONS

BACKGROUND OF THE INVENTION

This invention relates to electronic compositions, and more particularly, to metallizations useful in producing conductors on dielectric substrates.

Metallizations which are fired onto ceramic dielectric substrates to produce conductor patterns usually comprise finely divided noble metals and an inorganic binder, and usually are applied to the substrate as a dispersion of the inorganic powders in an inert liquid vehicle. Upon firing (usually in the range 700°–1000° C.), sintering occurs and the metallic component provides the functional (conductive) utility, while the binder (e.g., glass, $Bi_2O_3$, etc.) bonds metal particles to the substrate and to one another.

There is a need for conductor compositions in which noble metals are replaced by base metals such as copper, yet having good performance characteristics. Copper compositions are usually fired in an inert, nonoxidizing atmosphere (such as nitrogen) to prevent copper from reacting with oxygen in the air at elevated temperature. Some previous attempts to make copper compositions have used typical glass binders such as those having high bismuth oxide, cadmium oxide, or lead oxide contents. However, it has not been generally recognized that in the absence of air during firing at 700°–1000° C. copper metal can be oxidized to cuprous oxide, or further to cupric oxide, by reduction of some of the constituents of the glass binder. Bismuth oxide and cadmium oxide have been found to be particularly susceptible to reduction under such conditions, lead oxide being less susceptible. Accompanying the oxidation of copper metal to an oxide of copper is the reduction of bismuth oxide, cadmium oxide or lead oxide to the corresponding metal.

When copper metal is oxidized, the oxide is not solderable and leads to spots in the resultant fired metallization which are not soldered by typical solders such as Sn/Pb. Although not intended to be limiting, it seems that the reaction of copper with bismuth oxide is generally preceded by separation of the glass binder into two phases. One is a bismuth oxide rich phase which is absorbed by the copper metal surface. The remaining phase, often a lead borosilicate glass, does not wet the absorbed bismuth oxide phase and adhesion of the metallization is reduced. Tensile strength tests often show the specimens failing in the metallization itself. Where the absorbed layer of bismuth oxide phase has been reduced to bismuth metal during firing, the metallizations tend to fail by loss of adhesion to the substrate.

The above behavior is most inconvenient since $Bi_2O_3$, CdO and PbO are common constituents in producing glasses for metallizing compositions, in that they produce glasses of low viscosity and softening point, which wet the typical alumina dielectric substrates at the relatively low temperatures typically used in firing film metallization on substrates. They further provide useful levels of solderability and adhesion to the substrate.

SUMMARY OF THE INVENTION

I have discovered a new metallization for producing conductor patterns on a dielectric substrate, which although based upon copper, can be fired in a nonoxidizing atmosphere such as nitrogen to produce conductor patterns which exhibit good, reproducible conductivity, adhesion and solderability. The compositions of this invention comprise 85–97% finely divided copper powder (preferably 90–97%) and 3–15% finely divided glass powder (preferably 3–10%), wherein the glass powder is that of Table 1.

TABLE 1
GLASSES OF THIS INVENTION

| Component | Wt. % Operative Range | Preferred Range | Optimum Range |
|---|---|---|---|
| PbO | 40–70[1] | 45–55 | 45–55 |
| $PbF_2$ | 0–20[1] | 8–13 | 8–13 |
| $SiO_2$ | 7–27 | 7–20 | 7–20 |
| $Al_2O_3$ | 0–5 | 0–1 | 0–1 |
| $B_2O_3$ | 10–20 | 12–20 | 13–18 |
| $R_2O$ (R is Na,K) | 0.25–4[2] | 1–3 $Na_2O$[4] 0.25–1.5 $K_2O$[4] | 1–3 $Na_2O$[4] 0.25–1.5 $K_2O$[4] |
| $CeO_2$ | 0–5[3] | 1–3% | 1–3 |
| $TiO_2$ | 0–6[3] | 0–5% | 2–5 |

[1] Provided that the total weight of PbO plus $PbF_2$ in the glass is in the range 50–70%.
[2] Provided that the wt. of $K_2O$ is 0–40% of total wt. of $K_2O$ plus $Na_2O$.
[3] Provided that where total wt. of $CeO_2$ plus $TiO_2$ is 0–1%, there is at least 5% $PbF_2$; and where wt. of $PbF_2$ is 0–5%, there is at least 1% $CeO_2$ and/or $TiO_2$.
[4] Provided that total wt. of $Na_2O$ and/or $K_2O$ is 0.5–3%.

The glass may additionally comprise up to 10% MgO, CaO, SrO, BaO, $ZrO_2$, $MnO_2$, $Fe_2O_3$, CoO, ZnO, and/or $As_2O_3$ and/or up to 5% CdO, SnO, $Sb_2O_3$, and/or $WO_3$. Also of this invention are dispersions of these powder compositions in an inert liquid printing vehicle, as well as fired conductor patterns made with these powder compositions.

DETAILED DESCRIPTION

The essential component in the copper compositions of this invention is a glass of Table 1. These glasses provide excellent fired conductor properties despite being fired in nonoxidizing atmospheres. The problems inherent in the use of glasses rich in $Bi_2O_3$ and CdO are avoided, such as limited solder acceptance and failures in adhesion.

PbO is an essential component of these glasses to provide low viscosity and low softening point. At least 40% PbO should be present based on the total weight of the glass. In excess of 70% PbO tends to be reduced by dissolved copper under some firing conditions. $PbF_2$ may optionally be present in amounts up to 20%, $PbF_2$ being a powerful flux in combination with PbO and being less reducible by copper metal than is PbO. The total weight of PbO and $PbF_2$ in the glass is 50–70%. As PbO is increased, the beneficial effect of $PbF_2$ is reduced. The beneficial effect of $PbF_2$ is due to its higher anion to cation ratio than is the case in PbO. Preferred glasses comprise 45–55% PbO and 8–13% $PbF_2$, for minimized tendency to reduce, yet provide a low softening point.

$SiO_2$ is 7–27% of the glass, preferably 7–20%. It serves to provide adequate viscosity to reduce spreading of the metallizing binder, and inhibits crystallization and consequent loss of strength.

A small amount of $Al_2O_3$ (0–5%, preferably 0–1%) may be present to balance the effect of the alkali oxides $Na_2O$ and $K_2O$. If $Al_2O_3$ is omitted, the chemical durability of the glass versus water becomes lesser and solder leach resistance may decrease.

$B_2O_3$ strengthens glass formation although it also tends to reduce viscosity; 10–20% $B_2O_3$ is present, preferably 12–20%, more preferably 13–18%. The optimum concentration of $B_2O_3$ is strongly dependent only on that of $SiO_2$, the other "glass-former". Where there is high $SiO_2$, it is possible to enhance solderability and adhesion by introducing high $Bi_2O_3$.

The alkali oxides of $Na_2O$ and/or $K_2O$, although present as only 0.25-4% of the glass, are important constituents, since they introduce singly bonded oxygen atoms, lowering the softening point of the glass and enhancing wetting of the copper and the substrate. They also enhance the solderability in the glass of some of the more refractory glass constituents such as $Al_2O_3$ and $TiO_2$. A mixture of both and $K_2O$ is preferred due to enhancement of solderability. Optimum mixtures have a $Na_2O/K_2O$ weight ratio of about 2/1.

$CeO_2$ and $TiO_2$ may be present as 0-5% and 0-6%, respectively, preferably 1-3% $CeO_2$ and 0-5% $TiO_2$, more preferably 1-3% $CeO_2$ and 2-5% $TiO_2$. Small amounts of $TiO_2$ enhance acid resistance, although more than 5% increases refractoriness. To minimize a tendency toward phase separation and reduction of $Ti^{+4}$ to $Ti^{+3}$, $CeO_2$ is preferably introduced to maintain $TiO_2$ in the oxidized state during glass melting, as well as to lower the softening point.

Other conventional glass constituents may be present in moderate amounts with the exception of those that are easily reduced by such copper atoms as dissolve in the glass. Thus, CdO, SnO, $Sb_2O_3$ and $WO_3$ should total less than 5% of the glass. Other common glass constituents such as MgO, CaO, SrO, BaO, $ZrO_2$, MnO, $Fe_2O_3$, CoO, ZnO, and/or $As_2O_3$ may be present in fairly large amounts (up to 10% total) without unacceptable degradation.

The glass of this invention is prepared by conventional glass-making techniques, by mixing the desired components (or precursors thereof, e.g., $H_3BO_3$ for $B_2O_3$) in the desired proportions and heating the mixture to form a melt. As is well known in the art, heating is conducted to a peak temperature and for a time such that the melt becomes entirely liquid, yet gaseous evolution has ceased. In this work the peak temperature is in the range 1100°-1500° C., usually 1200°-1400° C. The melt is then fritted (particles are made) by cooling the melt, typically by pouring onto a cold belt or into cold running water. Particle size reduction can then be accomplished by milling as desired.

Neither the copper powder specifications nor the method of its preparation is critical for the purposes of this invention, so long as the size of the copper powder permits screen printing (0.5-10 m²/g.) and is substantially free of oxide.

The compositions of the present invention comprise finely divided inorganic powders (copper and glass) dispersed in inert vehicles. The powders are sufficiently finely divided to be used in conventional screen or stencil printing operations, and to facilitate sintering. Generally, the metallizations are such that at least 90% of the particles are no greater than 5 microns, and the surface area is 0.5-10 m²/g. In optimum metallizations substantially all the particles are less than 10 micron in size.

Other commonly used inorganic powders may be added, so long as the property improvements of the present invention are not obviated thereby.

The metallizing compositions are prepared from the solids and vehicles by mechanical mixing. The metallizing compositions of the present invention are printed as a film onto ceramic dielectric substrates in the conventional manner. Generally, screen stenciling techniques are preferably employed.

Any inert liquid may be used as the vehicle. Water or any one of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of inert liquid vehicle to solids in the metallizing compositions of this invention may vary considerably and depends upon the manner in which the dispersion of metallizing composition in vehicle is to be applied to the kind of vehicle used. Generally, from 0.5 to 20 parts by weight of solids per part by weight of vehicle may be used to produce a dispersion of the desired consistency. Preferred dispersions contain 10-25 vehicle and 90-75% solids.

In the inorganic solids, there is normally 85-97% copper and 3-15% glass. Lower copper yields fired conductors only difficultly wet by solder and hence incompletely soldered. Furthermore, conductivity is too low. Higher copper causes excessive leaching of the copper by solder so that pattern edge definition and adhesion are reduced. Lower glass gives inadequate adhesion and high glass increases viscosity too much. Preferably, there is 90-97% copper and 3-10% glass.

The metallizing compositions of the present invention are printed onto ceramic substrates, after which the printed substrate is fired to mature (sinter) the metallizing compositions of the present invention, thereby forming continuous conductors on the dielectrics.

The dielectric substrate used in the present invention to make multilayer capacitors may be any dielectric compatible with the electrode composition and firing temperature selected, according to principles well established in the art. Such dielectrics include barium titanate, barium zirconate, lead zirconate, strontium titanate, calcium titanate, calcium zirconate, lead zirconate, lead zirconate titanate, alumina, etc.

As indicated above, the metallizing compositions of the present invention are printed onto ceramic substrates, after which the printed substrate is fired in an inert atmosphere (such as nitrogen) to mature the metallizing compositions of the present invention, thereby forming continuous conductors. The printed substrate is fired at a temperature below the melting point of copper (to prevent loss of pattern definition), at a temperature high enough to mature (sinter) the pattern. These compositions are usually fired at a peak temperature in the range 700°-1000° C., for 5-15 min. at peak, and preferably are fired at about 900° C. for about 2 hours, 10-15 min. at peak.

EXAMPLES

The following examples and comparative showings are presented to illustrate the advantages of the present invention. In the examples and elsewhere in the specification and claims, all parts, percentages, proportions, etc., are by weight, unless otherwise stated.

Tables 2 and 3 list the compositions of melted glasses examined in this work, Table 2 listing various glasses of this invention and Table 3 glasses outside this invention. Softening points are listed. In the case of the glasses of Table 3, observations as to unacceptability of each glass are noted.

TABLE 2

MELTED GLASS COMPOSITIONS OF THIS INVENTION

| Component | Glass No. (Wt. %) | | | | | | | | | |
|---|---|---|---|---|---|---|---|---|---|---|
| | 1 | 2 | 3 | 4 | 5 | 6 | 7 | 8 | 9 | 10 |
| PbO | 47.6 | 51.9 | 63.0 | 63.0 | 47.7 | 47.1 | 46.7 | 46.7 | 52.7 | 54.7 |
| $PbF_2$ | 11.1 | 10.0 | — | — | 11.1 | 11.1 | 11.1 | 11.1 | 11.1 | 11.1 |
| $SiO_2$ | 21.6 | 24.4 | 17.4 | 15.4 | 19.3 | 17.1 | 17.2 | 17.2 | 11.2 | 9.2 |
| $Al_2O_3$ | 0.7 | 0.6 | 0.6 | 0.6 | 0.7 | 0.7 | 0.7 | 0.7 | 0.7 | 0.7 |
| $B_2O_3$ | 16.7 | 12.0 | 15.0 | 15.0 | 16.7 | 14.4 | 14.4 | 14.4 | 14.4 | 14.4 |
| $Na_2O$ | 1.7 | 1.1 | 2.0 | 2.0 | 1.7 | 1.7 | 2.2 | 2.2 | 2.2 | 2.2 |
| $K_2O$ | 0.6 | — | — | — | 0.6 | 0.6 | 1.1 | 1.1 | 1.1 | 1.1 |
| $CeO_2$ | — | — | 2.0 | — | 2.2 | 2.2 | 2.2 | 2.2 | 2.2 | 2.2 |
| $TiO_2$ | — | — | — | 4.0 | — | 4.4 | 4.4 | 4.4 | 4.4 | 4.4 |

TABLE 3

MELTED GLASS COMPOSITIONS NOT OF THIS INVENTION (COMPARATIVE) - wt. %

| Component | A | B | C | D | E | F | G | H | I | J | K | L | M | N |
|---|---|---|---|---|---|---|---|---|---|---|---|---|---|---|
| PbO | 73.3 | 78.0 | 63.0 | 53.0 | 43.0 | 43.0 | 43.0 | 42.0 | 60.4 | 56.4 | 51.4 | 68 | 62 | 28 |
| $PbF_2$ | — | — | — | — | 10.0 | 10.0 | 10.0 | 10.0 | — | — | — | — | — | — |
| $SiO_2$ | 15.4 | 9.4 | 19.4 | 19.4 | 19.4 | 17.4 | 15.4 | 15.4 | 24.4 | 24.4 | 24.4 | 19.4 | 19.4 | 19.4 |
| $Al_2O_3$ | 0.6 | 0.6 | 0.6 | 0.6 | 0.6 | 0.6 | 0.6 | 0.6 | 0.6 | 0.6 | 0.6 | 0.6 | 0.6 | 0.6 |
| $B_2O_3$ | 9.6 | 10.0 | 15.0 | 15.0 | 15.0 | 15.0 | 13.0 | 13.0 | 12.0 | 12.0 | 12.0 | 10.0 | 15.0 | 50.0 |
| $Na_2O$ | 1.1 | 2.0 | 2.0 | 1.5 | 1.5 | 1.5 | 1.5 | 2.0 | 1.1 | 1.1 | 1.1 | 2.0 | 3.0 | 1.5 |
| $K_2O$ | — | — | — | 0.5 | 0.5 | 0.5 | 0.5 | 1.0 | — | — | — | — | — | 0.5 |
| $CeO_2$ | — | — | — | — | — | 2.0 | 2.0 | 2.0 | — | — | — | — | — | — |
| $TiO_2$ | — | — | — | — | — | — | 4.0 | 4.0 | — | — | — | — | — | — |
| $Bi_2O_3$ | — | — | — | 1.0 | 10.0 | 10.0 | 10.0 | 10.0 | — | — | — | — | — | — |
| CdO | — | — | — | — | — | — | — | — | 1.0 | 5.0 | 10.0 | — | — | — |
| problem | Pb reduction | | too hard* | | Bi reduction | | | | Cd reduction | | | | | too hard |

*Means not fluid enough when softened.

The glasses were prepared from batches of the respective compounds or precursors thereof (litharge for PbO, flint for $SiO_2$, $Al_2O_3.H_2O$ for $Al_2O_3$, $Na_2CO_3$ for $Na_2O$, $B_2O_3$, 85% $K_2CO_3$ for $K_2O$, $PbF_2$, $CeO_2$ and $TiO_2$) and were best melted for 20-30 min. in platinum vessels to 1150-1200° C. Surface area of glasses used in these examples was 2-5$m.^2$/g.

The copper powder had a surface area of about $1m^2$/g. and was essentially free of oxygen.

Table 4 indicates the glass used, and the glass/copper vehicle ratio used, in producing fired conductors (on dense alumina substrates) according to this invention. The composition was printed through a 325-mesh screen onto a dense alumina substrate in the following pattern: A serpentine pattern was printed, as was a pattern of nine 200-mil square openings in a 3×3 matrix. The printed substrate was then dried at 110° C. for 10 min. and fired in nitrogen in a belt furnace to a peak temperature of 900° C., using a 2-hour program with 10 min. at peak. The fired conductor patterns were about 1 mil thick.

Conductance was determined on the serpentine pattern using a Fluke Instrument Co. Model 8800A D.C. ohmmeter.

Solderability was determined by dipping the pattern into a 60Sn/40Pb solder bath at 215° C.

Adhesion was found by placing a 20-gauge pretinned copper wire across three of the fired 200-mil square pads and then soldering, followed by pulling the soldered leads at 90° to the surface of the soldered pad with a Chatillon spring tester.

TABLE 4

COPPER METALLIZING COMPOSITIONS

| Composition (wt. %): | Number of Table 2 Glass Used | | | | | | | |
|---|---|---|---|---|---|---|---|---|
| | 9 | 1 | 7 | 6 | 2 | 3 | 4 | 5 |
| Copper | 80 | 77.3 | 77.3 | 77.9 | 80 | 77.3 | 80.4 | 76.7 |
| Glass | 6.2 | 6.0 | 6.0 | 5.4 | 6.2 | 6.0 | 2.9 | 6.7 |

TABLE 4-continued

COPPER METALLIZING COMPOSITIONS

| | Number of Table 2 Glass Used | | | | | | | |
|---|---|---|---|---|---|---|---|---|
| Ethyl cellulose/ terpineol, 1/9 | 13.8 | 16.7 | 16.7 | 16.7 | 13.8 | 16.7 | 16.7 | 16.7 |
| Fired Conductor Properties: | | | | | | | | |
| Conductance (milliohms/ sq.) | 1.7 | 2.5 | 2.3 | 3.4 | 3.5 | 4.0 | 3.2 | 4.3 |
| Solderability | exc. | fair | good | fair | good | fair | fair | fair |
| Adhesion (lb./in.²) | 5.5 | 5.3 | 5.1 | 3.4 | 4.5 | 3.0 | 4.0 | 4.6 |

I claim:

1. In compositions of finely divided metal powder and glass binder powder useful for forming conductor patterns on a dielectric substrate, wherein the improvement consists essentially of, as the metal powder, 85-97 weight % copper powder and, as the glass binder powder, 3-15 weight % of a glass powder comprising 40-70% PbO
0-20% $PbF_2$
7-27% $SiO_2$
0-5% $Al_2O_3$
10-20% $B_2O_3$
0.25-4% $M_2O$ wherein M is Na, K and mixtures thereof, provided that the weight of $K_2O$ is 0-40% of the total weight of $K_2O$ and $Na_2O$, 0-5% $CeO_2$
0-6% $TiO_2$, provided that (1) where the total weight of $CeO_2$ and $TiO_2$ is 0-1%, there is at least 5% $PbF_2$ present; (2) where the weight of $PbF_2$ is 0-5%, there is at least 1% $CeO_2$, $TiO_2$ or mixtures thereof, and (3) the total weight of PbO and $PbF_2$ is 50-70%.

2. Compositions according to claim 1 wherein the glass comprises
45-55% PbO
8-13% $PbF_2$ 7-20% $SiO_2$
0-1% $Al_2O_3$
12-20% $B_2O_3$
1-3% $Na_2O$
0.25-1.5 % $K_2O$,
provided that the total weight of $Na_2O$ and $K_2O$ is 0.5-3%
1-3% $CeO_2$
0-5 % $TiO_2$.

3. Compositions according to claim 3 wherein the glass comprises
45-55% PbO
8-13% $PbF_2$
7-20% $SiO_2$
0-1% $Al_2O_3$
13-18% $B_2O_3$
1-3% $Na_2O$
0.25-1.5% $K_2O$,
provided that the total weight of $Na_2O$ and $K_2O$ is 0.5-3%
1-3% $CeO_2$
2-5% $TiO_2$.

4. Compositions according to claim 1 wherein the glass additionally comprises up to 10% MgO, CaO, SrO, BaO, $ZrO_2$, MnO, $Fe_2O_3$, CoO, ZnO, and/or $As_2O_3$.

5. Compositions according to claim 2 wherein the glass additionally comprises up to 10% MgO, CaO, SrO, BaO, $ZrO_2$, MnO, $Fe_2O_3$, CoO, ZnO, and/or $As_2O_3$.

6. Compositions according to claim 3 wherein the glass additionally comprises up to 10% MgO, CaO, SrO, BaO, $ZrO_2$, MnO, $Fe_2O_3$, CoO, ZnO, and/or $As_2O_3$.

7. Compositions according to claim 1 wherein the glass additionally comprises up to 5% CdO, SnO, $Sb_2O_3$, and/or $WO_3$.

8. Compositions according to claim 2 wherein the glass additionally comprises up to 5% CdO, SnO, $Sb_2O_3$, and/or $WO_3$.

9. Compositions according to claim 3 wherein the glass additionally comprises up to 5% CdO, $Sb_2O_3$, and/or $WO_3$.

10. Compositions according to claim 1 of 90-97% copper powder and 3-10% glass powder.

11. Compositions according to claim 1 dispersed in an inert liquid vehicle.

12. Compositions according to claim 2 dispersed in an inert liquid vehicle.

13. Compositions according to claim 3 dispersed in an inert liquid vehicle.

14. A dielectric substrate bearing a conductor pattern of the composition of claim 1.

15. A dielectric substrate bearing a conductor pattern of the composition of claim 2.

16. A dielectric substrate bearing a conductor pattern of the composition of claim 3.

* * * * *